United States Patent
Roush et al.

(10) Patent No.: US 7,629,691 B2
(45) Date of Patent: Dec. 8, 2009

(54) CONDUCTOR GEOMETRY FOR ELECTRONIC CIRCUITS FABRICATED ON FLEXIBLE SUBSTRATES

(75) Inventors: Jerry A. Roush, Phoenix, AZ (US); John F. Schmidt, Phoenix, AZ (US); Sonia R. Dodd, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 1066 days.

(21) Appl. No.: 10/869,404

(22) Filed: Jun. 16, 2004

(65) Prior Publication Data

US 2005/0280157 A1    Dec. 22, 2005

(51) Int. Cl.
*H01L 23/538* (2006.01)
(52) U.S. Cl. ............... 257/773; 257/E23.177; 361/776
(58) Field of Classification Search ........... 257/773; 361/776
See application file for complete search history.

(56) References Cited

U.S. PATENT DOCUMENTS

| | | | |
|---|---|---|---|
| 3,519,890 A | 7/1970 | Ashby | |
| 4,728,751 A | 3/1988 | Canestaro et al. | |
| 6,261,863 B1 | 7/2001 | Beroz et al. | |
| 6,297,145 B1 * | 10/2001 | Ito | 438/619 |
| 7,265,298 B2 * | 9/2007 | Maghribi et al. | 174/254 |
| 7,337,012 B2 * | 2/2008 | Maghribi et al. | 607/152 |
| 7,491,892 B2 * | 2/2009 | Wagner et al. | 174/254 |
| 2002/0053464 A1 | 5/2002 | Schreiber et al. | |
| 2002/0094701 A1 * | 7/2002 | Biegelsen et al. | 439/32 |
| 2002/0153523 A1 * | 10/2002 | Bernius et al. | 257/40 |
| 2003/0047534 A1 * | 3/2003 | Takasugi | 216/27 |

* cited by examiner

*Primary Examiner*—Sue Purvis
*Assistant Examiner*—Benjamin P Sandvik
(74) *Attorney, Agent, or Firm*—Ingrassia Fisher & Lorenz, P.C.

(57) ABSTRACT

A flexible conductor formed on a flexible substrate. In one embodiment, a semiconductor device is disclosed. The semiconductor device comprises a periodic structure of islands and at least one conductor. The at least one conductor comprises a series of repeating geometric features affixed to the periodic structure of islands. The geometric features of the conductor are adapted to stretch the conductor rather than break the conductor when the substrate is bent.

19 Claims, 7 Drawing Sheets

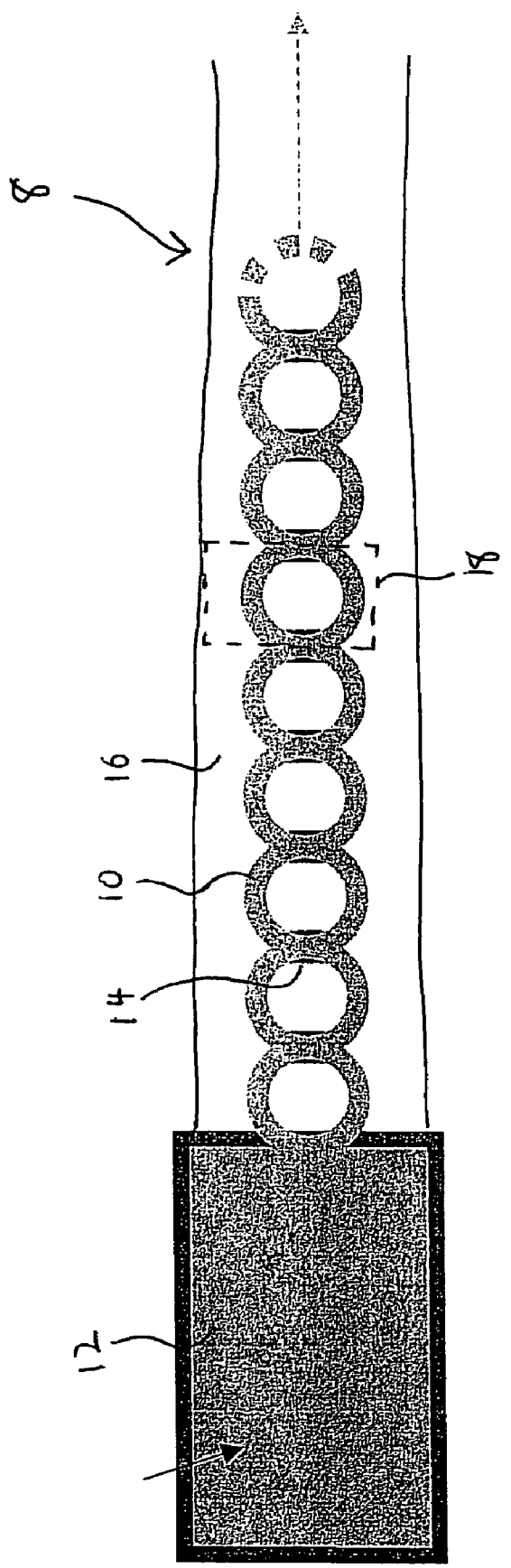

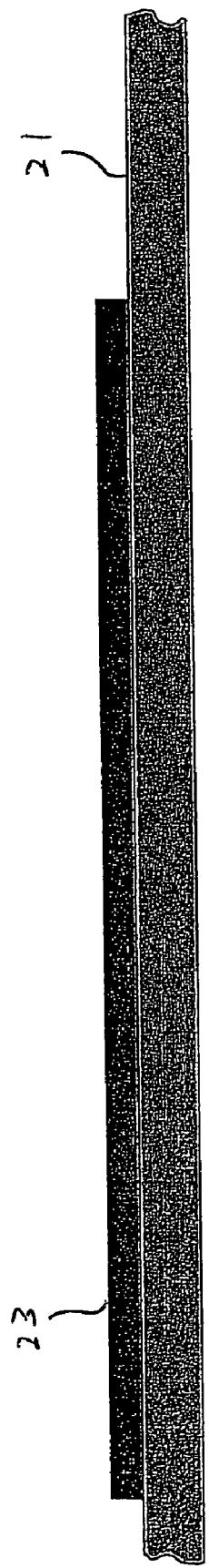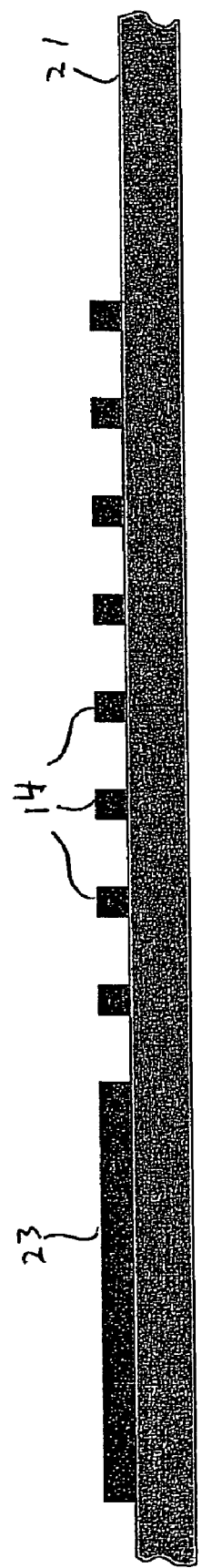
Fig. 2a
Fig. 2b

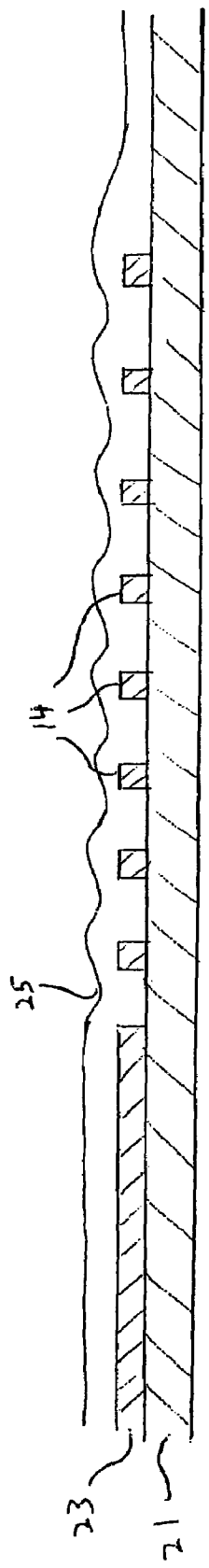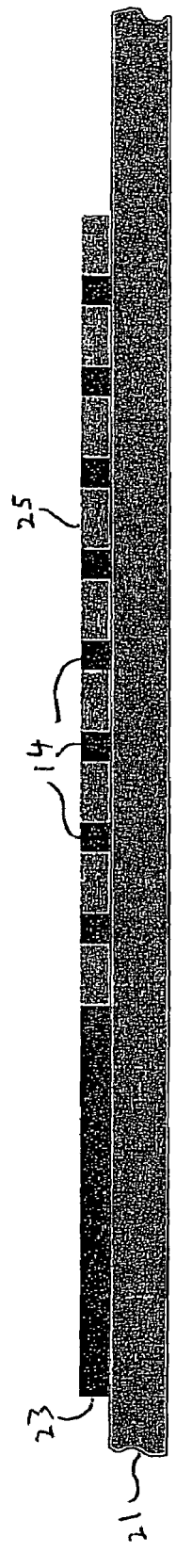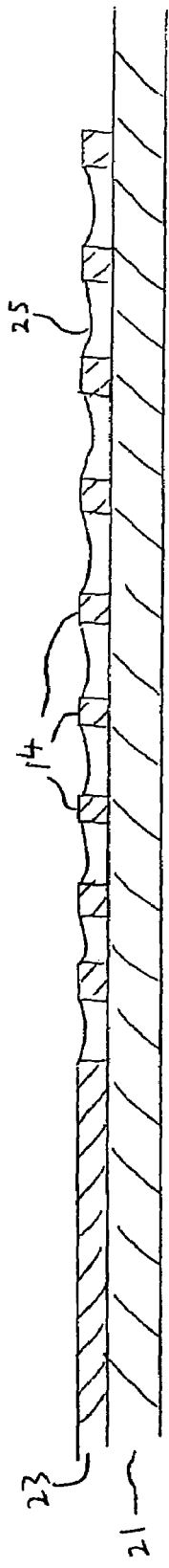

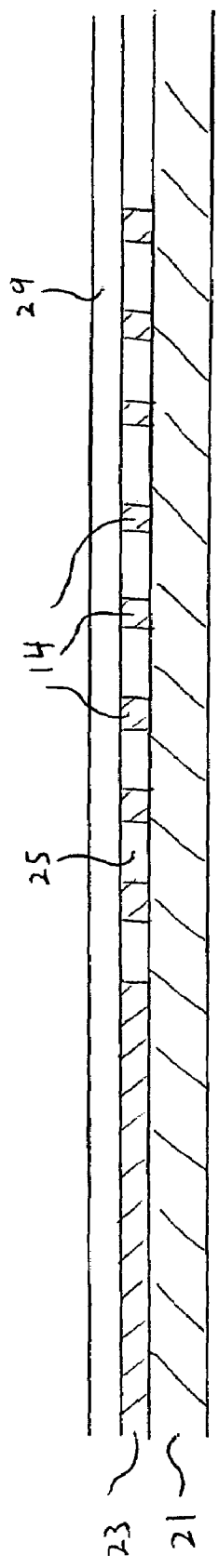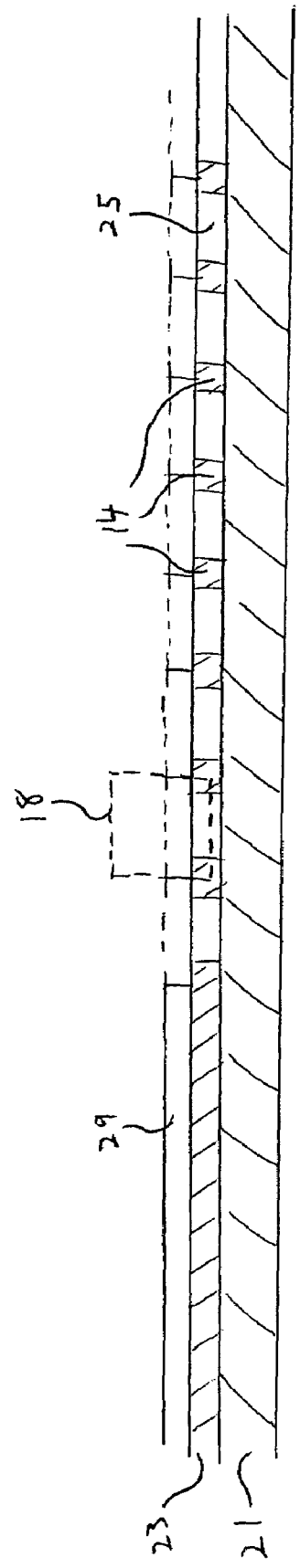

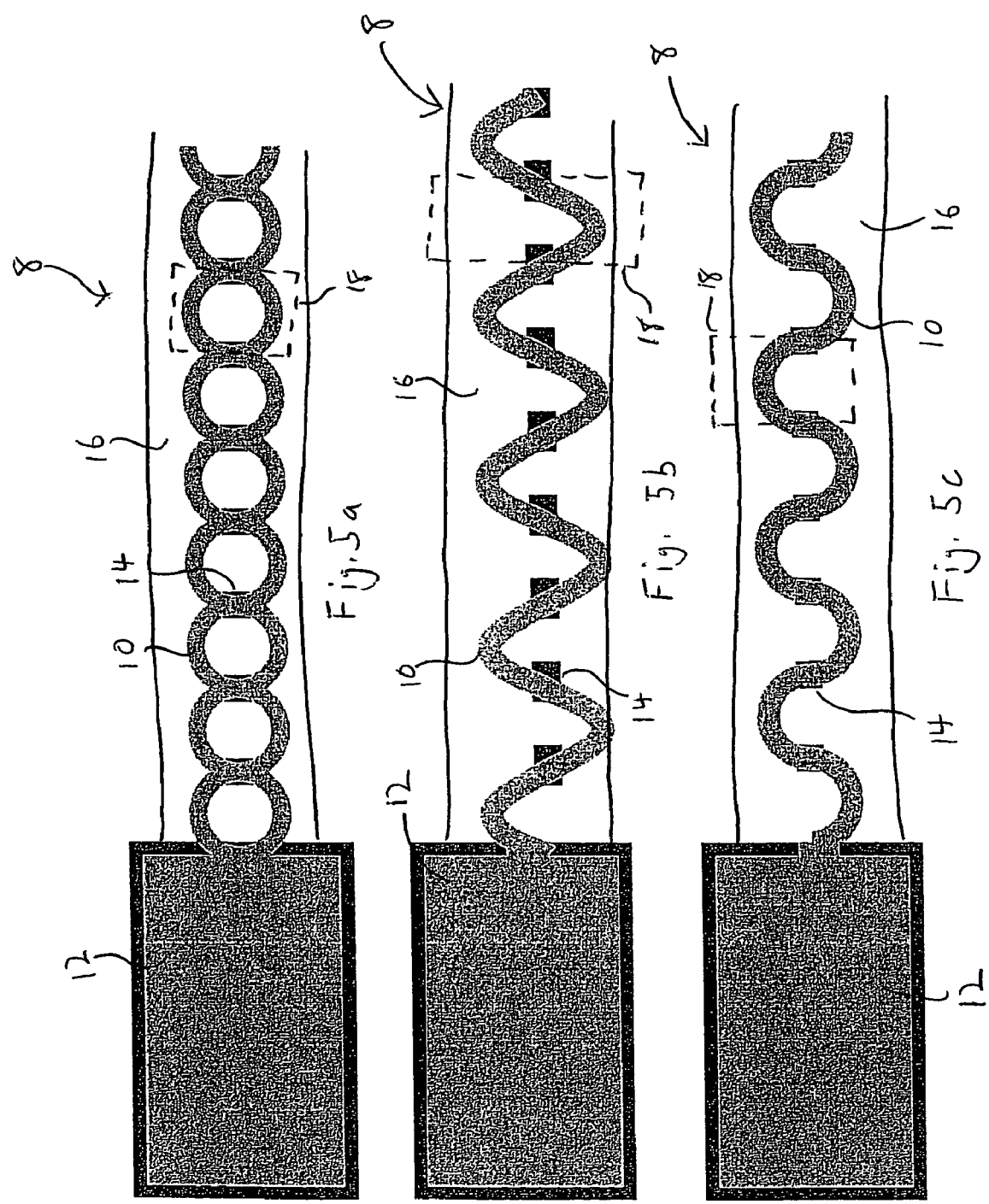

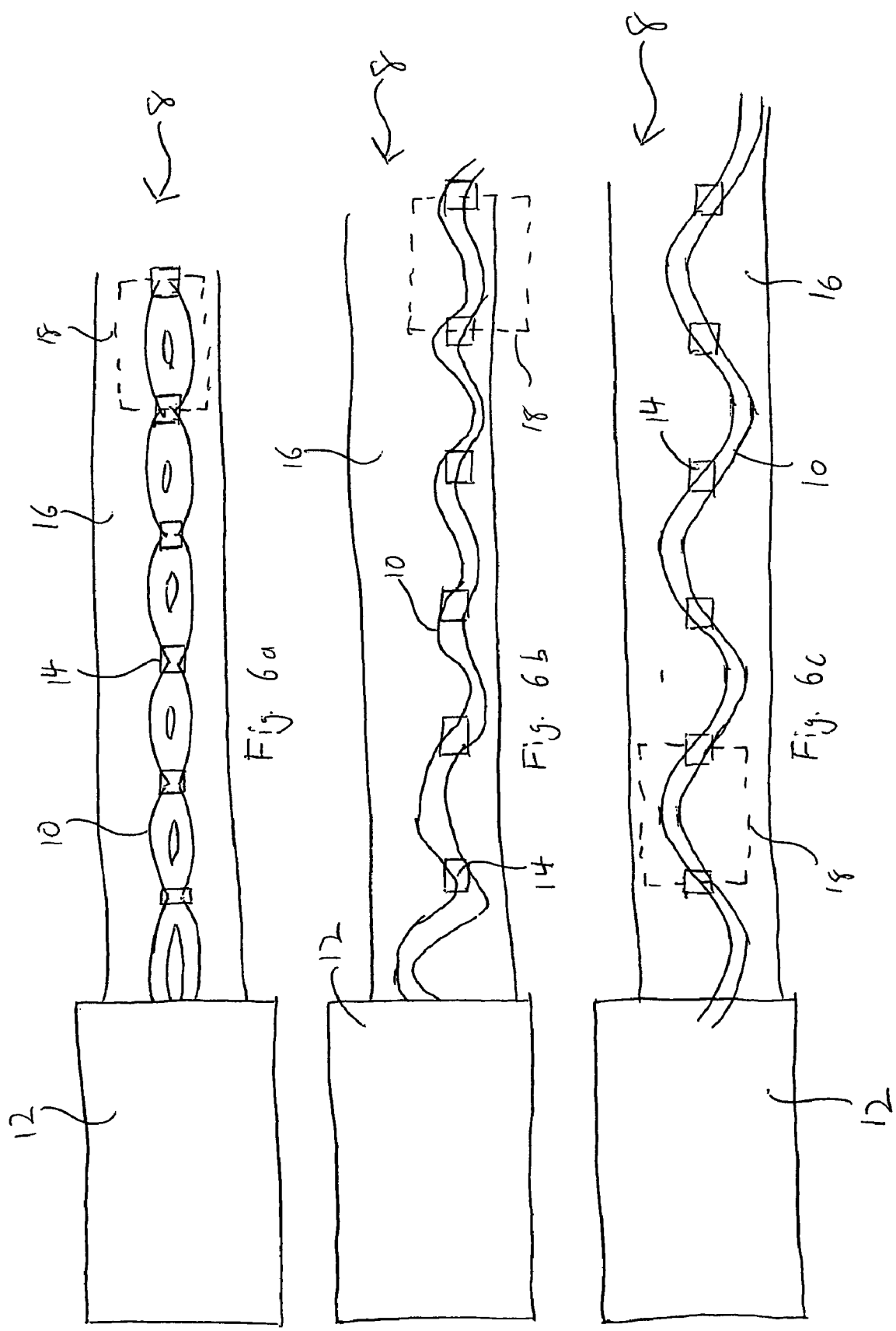

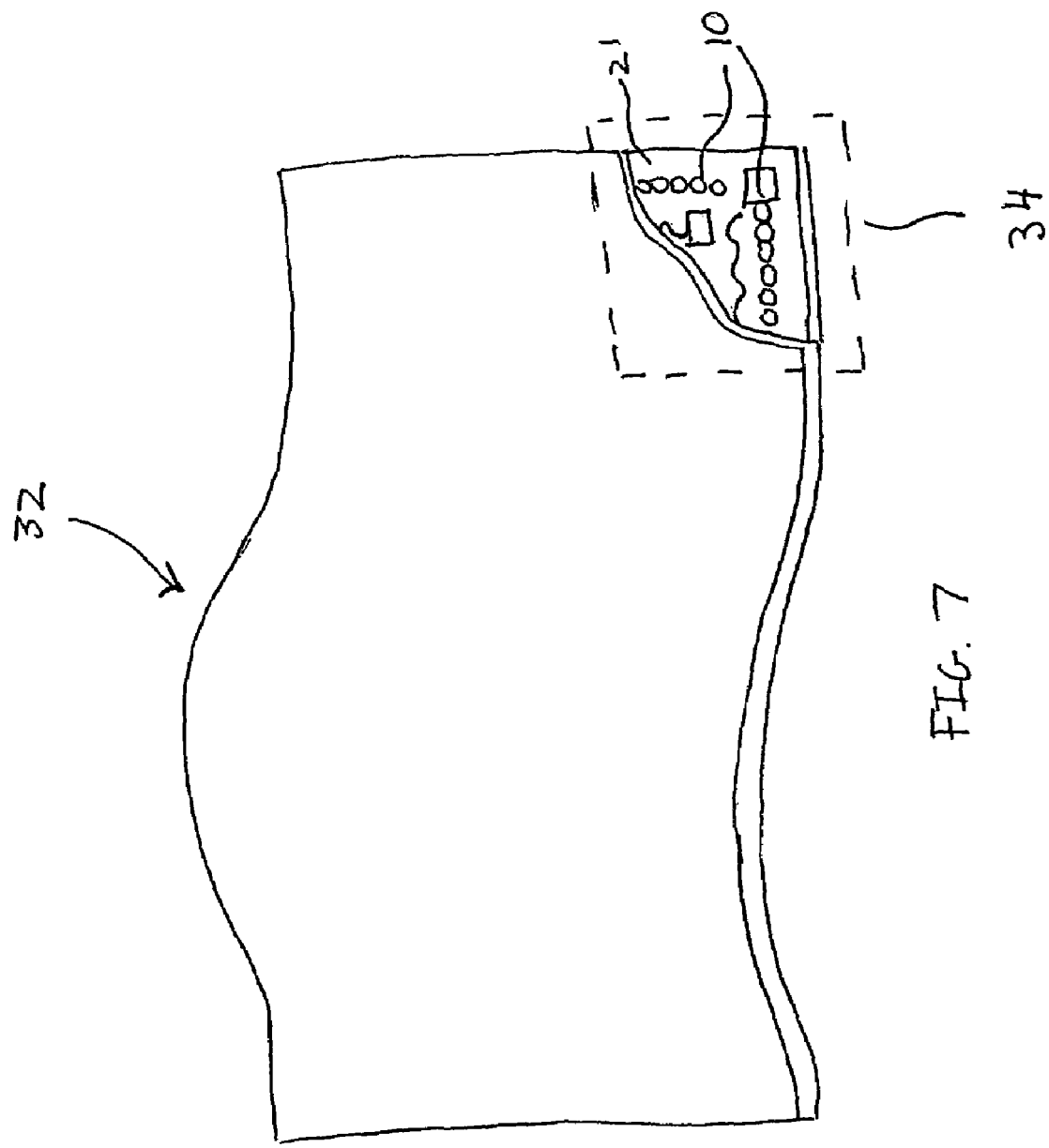

CONDUCTOR GEOMETRY FOR ELECTRONIC CIRCUITS FABRICATED ON FLEXIBLE SUBSTRATES

GOVERNMENT LICENSE RIGHTS

The U.S. Government has a paid-up license in this invention and the right in limited circumstances to require the patent owner to license others on reasonable terms as provided for by the terms of Contract No. MDA972-00-C-0005 awarded by the Defense Advanced Research Projects.

TECHNICAL FIELD

The following description relates to conductors, and more particularly, to conductors formed on flexible substrates.

BACKGROUND

Flexible substrates such as rolled steel foil, polymides, liquid crystal polymer, or other flexible plastics have considerable advantages over rigid substrates in a variety of applications. Flexible substrates can enable or improve the production of technologies such as flexible displays, curved circuits, curved detector arrays, thin film transistors (TFT), and display backplane matrices. Liquid crystal displays (LCD) and organic light emitting diodes (OLED) built on a flexible substrate can be made to conform to any shape, making them ideal for many applications, such as for a car dashboard or eventually an electronic newspaper. Flexible substrates can be thinner, lighter, less brittle, and more rugged than the rigid substrates that presently predominate.

However, despite their many advantages, flexible substrates offer new challenges as well. One challenge is maintaining the integrity of all of the layers during and after flexing of the substrate. When a device that has been manufactured on a flexible substrate is flexed, it creates stresses on all of the device layers since the substrate may be much thicker than any applied layer. Stress can also be generated by a mismatch of thermal expansion coefficients in the materials used, or a differential change in physical size due to changes in humidity or pressure. These stresses can cause cracking in the layers, and dramatically reduce the lifespan of electronic devices. This cracking can be especially destructive to the conductors in flexible electronic devices. Cracking causes the conductors to break, which renders devices inoperative.

One method used to address the problem of broken conductors is to increase their thickness such that they will not break when the substrate is bent. However, this does not guarantee that the conductor will not break. This practice also uses significantly more metal and may increase the cost of production, lower the accuracy of line placement, increase the processing time, and create unwanted topography during processing.

To produce electronic devices on flexible substrates suitable for consumer use, new methods are needed to overcome the limitations of the current methods. Thus, there remains a need for methods of manufacturing flexible electronics that ameliorate or eliminate the problem of broken conductors.

SUMMARY

The present invention addresses this need by providing a novel conductor geometry, such as for a semiconductor device, and methods of fabrication to facilitate the advantage offered by the novel conductor geometry. The invention disclosed herein offers advantages for semiconductor devices such as displays, and more specifically flexible displays. The invention also offers advantages for any semiconductor device that is susceptible to stresses on and between the different layers disposed above a substrate, such as stresses caused by changes in temperature, humidity or pressure.

In accordance with one embodiment of the present invention, a method of manufacturing an integrated circuit on a substrate comprises: forming a periodic structure of islands on the substrate; and forming at least one conductor over the periodic structure of islands, wherein the at least one conductor comprises a series of repeating geometric features.

In accordance with another embodiment, a semiconductor device is disclosed. The semiconductor device comprises a periodic structure of islands and at least one conductor. The at least one conductor comprises a series of repeating geometric features affixed to the periodic structure of islands. The geometric features of the conductor are adapted to stretch the conductor rather than break the conductor when the conductor is bent.

In accordance with still another embodiment, a method of forming conductors on a flexible substrate is disclosed. The method comprises forming a periodic structure of islands on the substrate and forming a conductor having repeating geometric features on the islands that are adapted to allow the conductor to flex instead of break when the substrate is bent.

In accordance with further embodiments, a conductor comprises a series of repeating flexible geometric features for use in semiconductor manufacturing.

In accordance with additional embodiments, a display comprises; at least one conductor that comprises a series of repeating flexible geometric features.

Thus, the present invention departs from conventional methods by providing conductors of a novel formation. These conductors are formed such that the conductors are less susceptible to breakage when stresses are applied such as by flexion.

The following detailed description and claims make apparent additional advantages and embodiments of the present invention.

DRAWINGS

The present invention can be more easily understood and further advantages and uses thereof more readily apparent, when considered in view of the description of the preferred embodiments and the following figures in which:

FIG. 1 is a plan view of a conductor in contact with an interconnect pad or circuit element in accordance with an embodiment of the present invention;

FIG. 2a is a cross-sectional view of a semiconductor in an intermediate processing stage in accordance with an embodiment of the present invention;

FIG. 2b is a cross-sectional view of the configuration of FIG. 2a after the insulator layer has been patterned in accordance with an embodiment of the present invention;

FIG. 3a is a cross-sectional view of the configuration of FIG. 2b with the addition of a release layer in accordance with an embodiment of the present invention;

FIG. 3b is a cross-sectional view of the configuration of FIG. 3a after the release layer has been etched in accordance with an embodiment of the present invention;

FIG. 3c is a cross sectional view of the configuration of FIG. 3a after the release layer has been etched in accordance with an alternative embodiment of the present invention;

FIG. 4a is a cross-sectional view of the configuration of FIG. 3b with the addition of a conductive layer in accordance with an embodiment of the present invention;

FIG. 4b is a cross-sectional view of the configuration of FIG. 4a after the conductive layer has been patterned in accordance with an embodiment of the present invention;

FIG. 5a is a plan view of the conductor in which the conductor comprises a series of conjoined circles in accordance with an embodiment of the present invention;

FIG. 5b is a plan view of the conductor in which the conductor comprises a sinusoid in accordance with an embodiment of the present invention;

FIG. 5c is a plan view of the conductor in which the conductor comprises a series of conjoined semicircles in accordance with an embodiment of the present invention;

FIG. 6a is a plan view of the configuration of FIG. 5a while the substrate is under flexion in accordance with an embodiment of the present invention;

FIG. 6b is a plan view of the configuration of FIG. 5b while the substrate is under flexion in accordance with an embodiment of the present invention;

FIG. 6c is a plan view of the configuration of FIG. 5c while the substrate is under flexion in accordance with an embodiment of the present invention; and FIG. 7 is a plan view of a display in accordance with an embodiment of the present invention.

In accordance with common practice, the various described features are not drawn to scale but are drawn to emphasize specific features relevant to the present invention. Reference characters denote like elements throughout Figures and text.

DETAILED DESCRIPTION

The primary embodiments of the invention will now be discussed in detail, examples of which are illustrated in the accompanying figures. Illustrated embodiments are presented by way of example and are not to be construed as limitations. All alternatives, modifications, and equivalents that fall within the scope and spirit of the invention are incorporated herein. For example, it is understood by a person of ordinary skill in the art that while only certain geometric configurations such as conjoined circles are described herein, other configurations such as a triangle pattern may be used.

The present invention may be employed in combination with conventional semiconductor techniques. This description is presented with enough detail to provide an understanding of the present invention, and should not be construed to encompass all necessary steps in the manufacture of flexible electronics or in semiconductor fabrication.

Referring more particularly to the drawings, FIG. 1 illustrates a semiconductor device element 8 comprising a conductor 10 in electrical contact with an interconnect pad or circuit element 12 in accordance with an embodiment of the present invention. The conductor 10 comprises a series of repeating geometric features 18, is fixedly attached to a periodic structure of islands 14, and lies above a release layer 16.

FIG. 2a illustrates a cross-sectional view of a semiconductor device in an intermediate processing step in accordance with the present invention. The semiconductor device comprises a semiconductor substrate 21 on which an insulating material 23 has been deposited. The substrate 21 may comprise a plurality of layers that have been applied and patterned in previous processing stages, such as by chemical vapor deposition (CVD) or oxide growth. The insulator layer 23 comprises low-conductivity material such as Silicon Dioxide (SiO2), Silicon Nitride (SiNx), silicate glass and the like. One purpose of the insulator layer is to prevent shorts such as between adjacent devices.

In one embodiment, a photoresist is applied over the insulator layer and patterned by exposure to ultraviolet light. The pattern projected onto the photoresist in the present invention is that of a periodic structure of islands 14 that are aligned in the direction of the desired path of the conductor 10. The photoresist is then selectively removed by etching either the exposed or unexposed portions of the pattern, depending respectively on whether a positive or a negative photoresist is used. An etch process then transfers the pattern onto the insulator layer, using an appropriate etchant. For example, if the insulator material is Silicon Dioxide, then hydrofluoric acid is used as the etchant. The photoresist is subsequently removed to reveal the periodic structure of islands 14 as illustrated in FIG. 2b. The periodic spacing may be equal to the spacing of the geometric features 18 of the conductors 10.

FIG. 3a depicts a cross-sectional view of the semiconductor device after the deposition of a release layer 25 over the substrate 21 and periodic structure of islands 14. In one embodiment, the release layer comprises any material such as Teflon that the conductors 10 will not adhere to. In one embodiment, the release layer 25 is then patterned and etched using standard photolithographic processes. A photoresist pattern is used such that material is removed in areas where the islands are located, generating a co-planar layer of the periodic structure of islands 14 separated by portions of the release layer 25. FIG. 3b shows the planarity that may be created on the semiconductor device subsequent to patterning and etching the release layer 25.

In alternative embodiments the photolithography step is eliminated. In one alternative embodiment both the photolithography step and the etch step are eliminated. Instead, chemical mechanical planarization (CMP) is used to physically remove portions of the release layer 25 to expose the insulator layer 14 and create planarity between the insulator layer 14 and the release layer 25. By eliminating the photolithography step in one embodiment, use of the CMP reduces processing time and manufacturing cost.

In another alternative embodiment the release layer 25 is etched without the use of a patterned photoresist. The elimination of the photolithography step has the advantage of reducing processing time and cost, thereby increasing efficiency. However, this increases the difficulty in generating a co-planar topography. In one embodiment of the present invention a planar topography is not created between the release layer 25 and the insulator layer 14. Instead, an approximately co-planar topography is created, as illustrated in FIG. 3c.

FIG. 4a illustrates the structure formed in FIG. 3b after the deposition of a conductive layer 29. The conductive layer 29 comprises a layer of conductive material such as a layer of malleable metals like aluminum, gold, tungsten, copper and the like. The processes of evaporation and sputtering, collectively known as physical vapor deposition (PVP), may be used to apply the conductive layer 29 to the existing structure. In other embodiments, other techniques are used to apply the conductive layer 29. The conductive layer 29 is subsequently patterned and etched. In one embodiment, the conductive layer is patterned and etched using standard photolithography techniques. However, in other embodiments other techniques are used to patterned and etch the conductive layer 29. The conductive layer 29 is etched in accordance to the pattern on the photomask to generate a conductor that comprises a series of repeating geometric features 18. FIG. 4b shows the conductive layer 29 after it has been etched to yield the geometric features 18. The conductors 10 are continuous, but comprise a periodic string of the geometric features 18.

The repeating geometric features 18 can better be appreciated in FIGS. 5a, 5b, and 5c. FIGS. 5a, 5b, and 5c illustrate plan views of semiconductor device elements 8 comprising the conductors 10 after the conductive layers 29 have been patterned to form a series of periodic geometric features 18. In FIG. 5a the geometric features comprise repeating conjoined circles, in FIG. 5b the geometric features comprise a repeating sinusoid, and in FIG. 5c the geometric features comprise repeating conjoined semicircles. In each figure, the conductor 10 is attached to an interconnect pad or circuit element 12.

In each embodiment, as the substrate on which the conductors 10 lie flexes, the conductors 10 stretch without breaking. Since the conductors 10 are not affixed to the release layer 25, movement of the conductors 10 between the periodic structure of islands 14 is possible. In one embodiment, once the flexion is discontinued, the conductors 10 return to their original shape and position as would a spring. FIGS. 6a, 6b, and 6c illustrate the structures of FIGS. 5a, 5b, and 5c while the substrate is being flexed, respectively. In FIG. 6a, for example, the conjoined circles are stretched to resemble conjoined ovals. After flexion, the conjoined ovals would once again return to the shape of conjoined circles.

In accordance with another aspect of the present invention, the release layer 25 is removed after the conductors 10 have been patterned. The release layer 25 is removed by selectively etching the release layer 25 without etching the insulator layer 23. In this embodiment the release layer 25 comprises materials other than those that the conductive layer will not adhere to, so long as an etchant can be used to selectively remove the release layer 25 without etching the insulator layer 23. In one embodiment, the release layer 25 is removed and not replaced. In this embodiment air gaps are formed between portions of the conductor 10 and the substrate 21.

FIG. 7 illustrates a plan view of a display 29 with a cutout section 34 in accordance with an aspect of the present invention. The cutout section reveals a plurality of conductors 10 disposed on a substrate 21. In one embodiment the substrate 21 comprises a flexible substrate, and the conductors 10 comprise repeating geometric features 18. The display may be an organic light emitting diode, a polymer light emitting diode, a liquid crystal display, or the like. The conductors 10 are arranged in the display such that when the display bends or undergoes flexion, the conductors 10 stretch rather than break.

In view of the foregoing, it will be understood by those skilled in the art that the methods of the present invention can be used in conjunction with current semiconductor processing techniques. The above embodiments have been presented by way of example and not by way of limitation. Variations and modifications may occur, which fall within the scope of the present invention, as set forth in the following claims.

What is claimed is:

1. A semiconductor device comprising:
   a periodic structure of islands;
   a release layer between the periodic structure of islands; and
   at least one conductor that comprises a series of repeating geometric features affixed to the periodic structure of islands, the geometric features of the at least one conductor are adapted to stretch the at least one conductor rather than break the at least one conductor when the at least one conductor is bent.

2. The semiconductor device of claim 1, wherein the release layer comprises a material to which the at least one conductor will not adhere.

3. The semiconductor device of claim 1, wherein the periodic structure of islands comprises an insulator material.

4. The semiconductor device of claim 3, wherein the insulation material is formed from low-conductivity material.

5. The semiconductor device of claim 3, wherein the insulator material is one selected from a group comprising Silicon Dioxide, Silicon Nitride and silicate glass.

6. The semiconductor device of claim 1, wherein the repeating geometric features are selected from a group comprising repeating conjoined circles, a repeating sinusoid, and repeating conjoined semicircles.

7. The semiconductor device of claim 1, wherein the at least one conductor is formed from malleable metal.

8. The semiconductor device of claim 1, wherein the at least one conductor is selected from a group comprising aluminum, gold, tungsten, and copper.

9. The semiconductor device of claim 1, wherein the device is formed on a flexible substrate.

10. A display comprising:
    at least one conductor that comprises a series of repeating flexible geometric features;
    a periodic structure of islands, wherein the at least one conductor is affixed to the periodic structure of islands; and
    a release layer between the periodic structure of islands.

11. The display of claim 10, wherein the release layer comprises a material to which the at least one conductor will not adhere.

12. The display of claim 10, wherein the periodic structure of islands comprises an insulator material.

13. The display of claim 12, wherein the insulator material is formed from low-conductivity material.

14. The display of claim 12, wherein the insulator material is one selected from a group comprising Silicon Dioxide, Silicon Nitride and silicate glass.

15. The display of claim 10, wherein the repeating geometric features are selected from a group comprising repeating conjoined circles, a repeating sinusoid, and repeating conjoined semicircles.

16. The display of claim 10, wherein the at least one conductor is formed from malleable metal.

17. The display of claim 10, wherein the at least one conductor is selected from a group comprising aluminum, gold, tungsten, and copper.

18. The display of claim 10, wherein the display is a flexible display.

19. The display of claim 18, wherein the flexible display is one selected from a group comprising organic light emitting diodes, polymer light emitting diodes, and liquid crystal displays.

* * * * *